United States Patent [19]

Matsumoto

[11] 4,163,976
[45] Aug. 7, 1979

[54] SEMICONDUCTOR LASER DEVICE
[75] Inventor: Nobuo Matsumoto, Tokorozawa, Japan
[73] Assignee: Nippon Telegraph and Telephone Public Corporation, Tokyo, Japan
[21] Appl. No.: 866,959
[22] Filed: Jan. 5, 1978
[30] Foreign Application Priority Data Jan. 21, 1977 [JP] Japan .................................... 52-5008

[51] Int. Cl.² ............................................. H01S 3/19
[52] U.S. Cl. ................................ 331/94.5 H; 357/18
[58] Field of Search .................... 331/94.5 H; 357/17, 357/18

[56] References Cited
FOREIGN PATENT DOCUMENTS 2716750 10/1977 Fed. Rep. of Germany ..... 331/94.5 H

OTHER PUBLICATIONS

DeWaard, "Stripe-Geometry D. H. Lasers with Linear Output/Current Characteristics," *Electronics Letters,* Jul. 7, 1977, vol. 13, No. 14, pp. 400-401.
Oe et al., "GaInAsP-InP Double Heterostructure Lasers . . .," *Japan. J. Appl. Phys.,* vol. 15, (1976), No. 10, pp. 2003-2004.

*Primary Examiner*—James W. Davie
*Attorney, Agent, or Firm*—Burns, Doane, Swecker & Mathis

[57] ABSTRACT

In a group III - V semiconductor laser of a double heterostructure, a semiconductor laser device having a bent stripe which forms a planar stripe structure. The bent stripe comprises two straight parts respectively perpendicular to cleavage planes which are parallel with each other and a part having curvatures and disposed between the straight parts.

1 Claim, 6 Drawing Figures

SEMICONDUCTOR LASER DEVICE

This invention relates to semiconductor laser devices having a bent stripe and, more particularly, to a semiconductor laser device in which a part having curvatures is provided in a stripe formed in a surface epitaxial layer and light confinement layer beneath said epitaxial layer of a semiconductor epitaxial wafer having a double heterostructure.

Generally, in semiconductor laser devices, it has been one of the most important techniques to render the transverse mode to be single, in order to achieve a highly efficient coupling of the device to single mode glass fibers and an improved linearity in electric current to light output characteristics. As measures of achieving the above, such lasers as (a) rib guide laser, (b) buried laser, (c) channeled substrate planar laser, (d) narrow stripe laser, and (e) deep impurity diffusion laser have already been suggested. In these lasers, (a), (b) and (c) have defects in that since they have special structures to form the laser devices, a high epitaxial growth technique is necessary. Further a preferential etching and other fabricating steps usually not required are added so that they are very difficult to fabricate, and such difficulty reduces their yielding rate and causes unfavorable influences on the life of the devices.

The narrow stripe laser (d) achieves, on the other hand, the single transverse mode oscillation by making the width of the stripe so much narrower than the usual width of 10 μm as to be about 1 to 5 μm in the planar stripe structure which is one of the most conventional structures in the semiconductor laser devices, and this laser is to fabricate. However, this laser is still defective in that current density at an oscillation threshold level increases substantially in reverse proportion to the width of the stripe and that, in order to obtain the same output of light intensity, end surfaces of the laser are deteriorated with increased light intensity inside the stripe.

The deep impurity diffusion laser (e) is a modification of the planar stripe structure and has a structure in which a diffusion area of a p-type impurity (Zn) forming the stripe is caused to penetrate through the active layer and to reach at its front the first layer. This laser device also has defects in that, as the impurity is diffused even into the active layer, a crystalline dislocation is likely to occur and the life is reduced.

The present invention has been suggested to remove such defects as described above. According to the present invention, the problems have been successfully solved by providing a part having curvatures in a stripe formed in a surface epitaxial layer and light confinement layer beneath the surface epitaxial layer in a semiconductor epitaxial wafer of a double heterostructure.

According to the present invention, there is provided a semiconductor laser device having a bent stripe, which comprises an epitaxial wafer of group III-V semiconductors formed on a substrate and having a double heterostructure, a stripe formed by diffusing an impurity into the wafer to convert a conduction type of a surface epitaxial layer into a reverse conduction type in the form of a stripe. The stripe is of a depth not reaching an active layer while remaining in the light confinement layer above the active layer. Ohmic electrodes are formed respectively on the surface epitaxial layer and bottom surface of the substrate. The stripe comprises two straight parts perpendicular to cleavage planes of the device which are parallel to each other and a curved part disposed between said straight parts, said curved part being smoothly connected to the straight parts continuously and having points of curvature in the middle.

A primary object of the present invention is, therefore, to provide a semiconductor laser device wherein the oscillation transverse mode is single and the linearity of the current to light output characteristics is high.

Another object of the present invention is to provide a semiconductor laser device which is easy to fabricate and has a simple structure.

Other objects and advantages of the present invention shall become clear from the following disclosure with reference to the accompanying drawings, in which.

Figure 1:
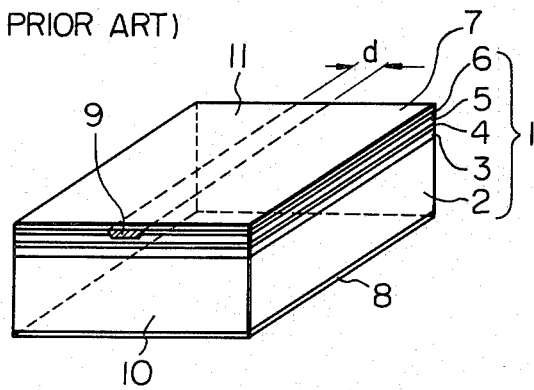
FIG. 1 shows in perspective view a laser device having a conventional stripe.

In FIG. 1 showing a conventionally used semiconductor laser device, metallic electrodes 7 and 8 are formed by evaporation on both surfaces of a semiconductor wafer 1 having a double heterostructure in which an n-type $Al_{0.3}Ga_{0.7}As$ layer 3, n-type $Al_{0.06}Ga_{0.94}As$ layer 4, p-type $Al_{0.3}Ga_{0.7}As$ layer 5 and n-type GaAs layer 6 are epitaxially grown in a liquid phase sequentially on a surface of an n-type GaAs substrate 2.

In this semiconductor device, a stripe 9 is formed by a selective diffusion of Zn or any other method so as to allow an electric current to flow only through the lower part of the stripe, and two planes 10 and 11 respectively in parallel with one another and perpendicular to the stripe 9 are formed by cleaving, which planes are to be utilized as mirror surfaces for resonance.

In this conventional semiconductor laser device, there are defects in that, if the width d of the stripe 9 is above 20 μm, the linearity of the current to light-output characteristics will be high but the total current at the threshold level will increase and, if 10 μm $<$ d $<$ 20 μm, the linearity will remarkably reduce. On the other hand, if d $<$ 10 μm, the linearity will be again high but the threshold level current density will increase and, in order to obtain the same output light intensity as in the case of the wider stripe, the intensity within the stripe will increase, whereby the laser's end surface planes will be deteriorated.

Figure 2:
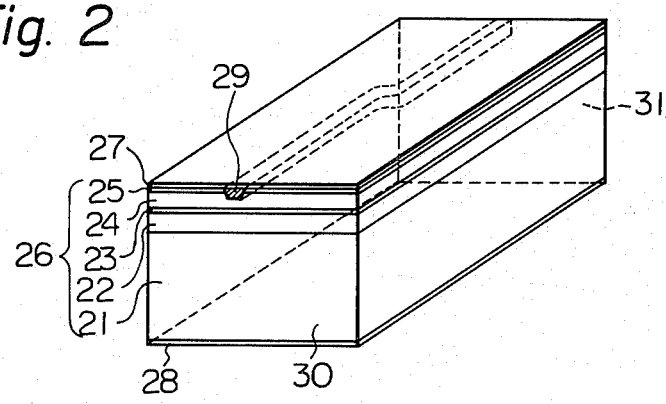
FIG. 2 shows also in perspective view an embodiment of a semiconductor laser device having a bent stripe according to the present invention.

In the embodiment of a laser device of the present invention shown in FIG. 2, a Cr-Au alloy layer 27 and Au-Ge-Ni alloy layer 28 are formed as ohmic electrodes respectively on the upper and lower surfaces of a semiconductor wafer 26 having a double heterostructure in which an n-type $Al_xGa_{1-x}As$ layer 22, n-type $Al_yGa_{1-y}As$ layer 23 which is an active layer, p-type $Al_xGa_{1-x}As$ layer 24 and n-type GaAs layer 25, wherein y $<$ x, are epitaxially grown in turn on an n-type GaAs substrate 21, and a Zn diffused stripe 29 is formed in such that Zn is diffused to the vicinity of the active layer 23 from the wafer surface, that is, to a depth including the p-type $Al_xGa_{1-x}As$ layer 24 and n-type GaAs layer 25 but not reaching the active layer 23.

A pair of parallel opposed cleavage planes 30 and 31 are formed respectively on the end surfaces of the wafer. The stripe 29 is perpendicular to the cleavage planes, is formed as a narrow layer extending between the opposing cleavage planes 30 and 31, and a bent part having curvatures as will be detailed later is formed at a position intermediate the stripe, that is, between two straight parts.

In the present embodiment, the strip 29 is formed in the following manner. The p-type $Al_xGa_{1-x}As$ layer 24 of a thickness of 2 $\mu$m and n-type GaAs layer 25 of a thickness of 1 $\mu$m are formed of the active layer 23 which is of n-type $Al_yGa_{1-y}As$ of a thickness of 0.5 $\mu$m, a $SiO_2$ film (not illustrated) is formed on the n-type GaAs layer 25, a narrow elongated window of a shape corresponding to that of the intended stripe and of a width of 10 $\mu$m is formed in this $SiO_2$ film and Zn is selectively diffused through said window to a depth of about 2 $\mu$m, that is, to a depth over the n-type GaAs layer 25 to the middle of the p-type $Al_xGa_{1-x}As$ layer 24, but not reaching the active layer 23. When the stripe 29 is thus made, the $SiO_2$ film is removed with a fluoric acid, thereafter the ohmic electrode 27 is formed over the entire surface of the layer 25 including the stripe 29 and the parallel cleavage planes 30 and 31 are formed as the resonator of the device.

Figure 3:
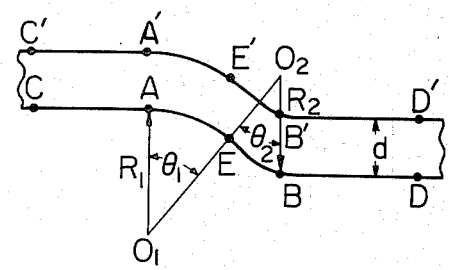
FIG. 3 shows schematically the shape of the stripe in FIG. 2.

Now the shape of the strip 29, specifically of the bent part, shall be explained with reference to FIG. 3. From an end point A of an edge line CA of a first straight part of the stripe, a first arc $\widehat{AE}$ of a radius $R_1$ of curvature with a center $O_1$ is formed, with its first end point E, a second arc $\widehat{EB}$ of a radius $R_2$ of curvature with a center $O_2$ on the other side of the tangent at the point E of the stripe edge line is connected and, with an end point B of the second arc $\widehat{EB}$, a second straight part BD of the stripe is connected. The straight line CA, arcs $\widehat{AE}$ and $\widehat{EB}$ and straight line BD are smoothly connected with one another, and thus one edge line $\overline{CAEBD}$ of the stripe is formed. The other edge line $\overline{C'A'E'B'D'}$ is made by parallelly moving the above described one edge line $\overline{CAEBD}$ by the width d of the stripe perpendicularly to the straight part BD. In the thus formed stripe 29, the angle anticipating the first arc $\widehat{AE}$ shall be $\theta_1$ and the angle anticipating the second arc $\widehat{EB}$ shall be $\theta_2$.

In the semiconductor laser device consisting of a double heterostructure wafer of AlGaAs - GaAs having the stripe in the above explained shape, the oscillation characteristics with the shape of the stripe as a parameter are as follows:

Eight samples of the laser device for respective three different type stripes which are (i) straight over the length, (ii) having a bent part of $R_1 = R_2 = 1000$ $\mu$m, $\theta_1 = \theta_2 = 5.6°$, and (iii) having a bent part of $R_1 = R_2 = 250$ $\mu$m, $\theta_1 = \theta_2 = 16°$ were prepared and their current to light-output characteristics were measured. In the measurement, the electrode 27 shown in FIG. 2 was made the plus side, the electrode 28 was made the minus side, a voltage was applied to them and an electric current was poured into the semiconductor wafer to observe a light emission. The light intensity was measured with a pin photodiode and the photo-exciting current value was read. Table I shows the results of the observations.

Table I

| Stripe | Sample No. | Threshold level (mA) | Linearity |
|---|---|---|---|
| (i) | 1 | 90 | Below 1.1 Jth |
|  | 2 | 92 |  |
|  | 3 | 97 |  |
|  | 4 | 100 |  |
|  | 5 | 103 |  |
|  | 6 | 105 |  |
|  | 7 | 110 |  |
|  | 8 | 110 |  |
| (ii) | 1 | 130 | Above 2 Jth |
|  | 2 | 135 |  |
|  | 3 | 142 |  |
|  | 4 | 145 |  |
|  | 5 | 150 |  |
|  | 6 | 153 |  |
|  | 7 | 155 |  |
|  | 8 | 160 |  |
| (iii) | 1 | 230 | Above 2 Jth |
|  | 2 | 230 |  |
|  | 3 | 242 |  |
|  | 4 | 246 |  |
|  | 5 | 250 |  |
|  | 6 | 255 |  |
|  | 7 | 267 |  |
|  | 8 | 270 |  |

In this case, the thickness of each layer in the wafer of the respective samples was as follows: The substrate 21 was 100 $\mu$m thick, the layer 22 was 5 $\mu$m thick, the layer 23 was 0.5 $\mu$m thick, the layer 25 was 2 $\mu$m thick and the layer 25 was 1 $\mu$m thick. The thickness of the electrode 27 was 3000 Å and that of the electrode 28 was 2000 Å.

Figure 4:
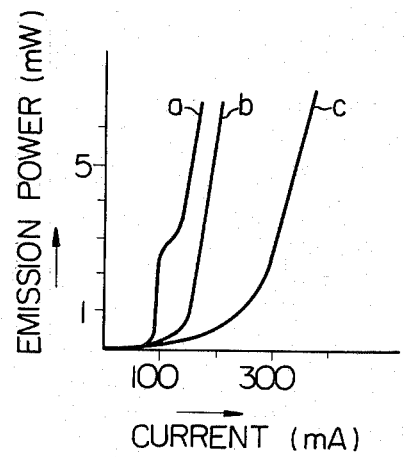
FIG. 4 shows the current to light output characteristics of the device according to the present invention.

FIG. 4 shows diagrammatically the data on Sample 1 of the respective types of stripe (i)–(iii) shown in Table I. They coincide well with those of the other seven samples and, thus, it is recognized that the laser device of the present invention is very high in reproducibility. In the diagram, the characteristic curve a represents the sample of the type (i), b represents the sample of type (ii) and c represents the sample of type (iii). It is to be observed that, while in the characteristic curve a, a kink is produced in the current to light-output characteristic curve, there is produced no kink in the characteristic curves b and c. Accordingly, it is found that the linearity of the current to light-output characteristics is remarkably improved. The reason for this phenomenon is that the radiation loss of the laser beam due to the bend of the stripe is so large in the higher transverse mode that the oscillation takes place only in the fundamental mode. If the case of the stripe having the bent part of $R_1 = R_2 = 1000$ $\mu$m and $\theta = 5.6°$, for example, the radiation loss in the fundamental mode is about 1 dB and that in the higher transverse mode is above 2 dB.

Referring to the relations between the radius R of curvature of the arc in the stripe and the angle $\theta$ anticipating the arc:

If the width of the stripe is d under the condition that the straight parts of the stripe does not overlap, then $$\left. \begin{array}{l} R_1(1 - \cos \theta_1) < d \text{ and} \\ R_2(1 - \cos \theta_2) < d \end{array} \right\} \quad (1)$$

If the length of the laser device is L, it will be necessary that the sum of the two arcs in the lengthwise direction should be shorter than L, so that $$R_1 \sin \theta_1 + R_2 \sin \theta_2 < L \qquad (2)$$

If the oscillation threshold level in the case of the straight stripe is Jth$^{(o)}$, it will be necessary that the oscillation threshold level in the case of the stripe of the present invention should be practically below 3 Jth$^{(o)}$, thus $$\theta_1/R_1 = \theta_2/R_2 < 0.16 \qquad (3)$$

Consequently, it is preferable that R and $\theta$ are in the range with which the above three conditions are satisfied. Here $\theta$ is represented in degrees and $R_1$, $R_2$, L and d are respresented in μm.

Figure 5:
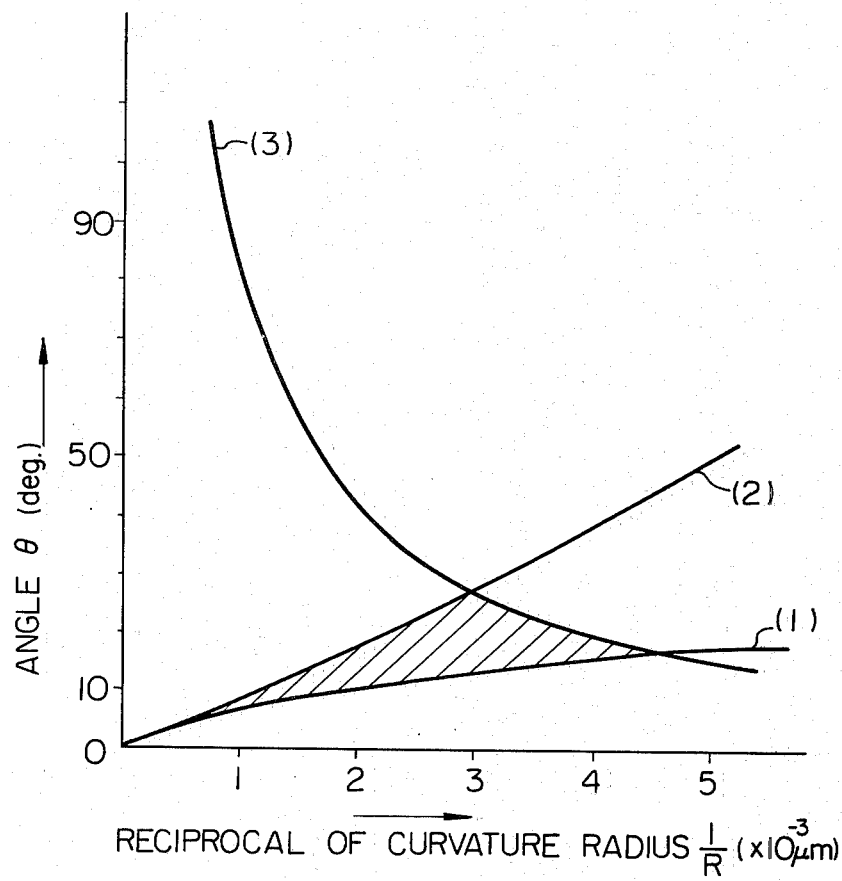
FIG. 5 is a diagram showing the relation between the radius of curvature and the anticipated angle $\theta$.

FIG. 5 shows diagrammatically the relation of the above formulas (1), (2) and (3) in the case of $R_1 = R_2$ and $\theta_1 = \theta_2$, wherein a hatched area shows the preferable range for R and $\theta$.

Figure 6:
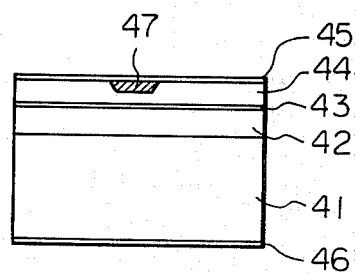
FIG. 6 is a side view in elevation of a laser device in another embodiment of the present invention.

FIG. 6 shows another embodiment of the present invention, in which an n-type InP epitaxial layer 42, $Ga_{1-y}In_yAs_{1-x}P_x$ layer 43 wherein $0.5 < y < 0.8$ and $0 < x < 0.4$ and p-type Inp layer 44 are formed on an n-type InP substrate 41, and a Cr-Au alloy layer 45 and Au-Sn alloy layer 46 are formed as electrodes respectively on the upper surface of the p-type InP layer 44 and the lower surface of the substrate 41. A Zn diffused stripe 47 is formed in the layer 44 so as to be of a diffusion depth reaching the middle of the layer 44 but not reaching the active layer 43.

As an experiment example in this embodiment, the substrate 41 is 100 μm thick, the layer 42 is 5 μm thick, the layer 43 is 0.5 μm thick, the layer 44 is 3 μm thick and the electrodes 45 and 46 are respectively 3000 and 2000A thick.

Even the above embodiment of such structure as in FIG. 6 achieves the same effect of remarkably improving the linearity of the current to light-output characteristics as in the first embodiment.

As has been described in the foregoings, the present invention has an effect that a high quality semiconductor laser device remarkably improved in the linearity of the current to light-output characteristics can be easily provided at a high yielding rate with such a simple measure of providing in the stripe a bent part having the curvatures as described, and a laser device high in desired characteristics as a light source for optical communications can be obtained.

What is claimed is:

1. A semiconductor laser device having a bent stripe, comprising: an epitaxial wafer having an active layer and a light confinement layer formed on a substrate with group III - V semiconductors in a double heterostructure, a stripe for converting a conduction type of a surface epitaxial layer of said wafer into a reverse conduction type formed by diffusing an impurity element in said light confinement layer to a depth not reaching said active layer and ohmic electrodes formed respectively on said surface epitaxial layer including said stripe and on the reverse surface of the substrate, said substrate having cleavage planes parallel with each other to form a resonator of the device, said stripe comprising two straight parts perpendicular to said cleavage planes and a bent part disposed between said straight parts which has the same width as said two straight parts and comprises two arcs smoothly continuously connected with said straight parts and satisfying the conditions $$R_1(1-\cos \theta_1) < d,$$

$$R_2(1-\cos \theta_2) < d,$$

$$R_1 \sin \theta_1 = R_2 \sin \theta_2 < L \text{ and}$$

$$\theta_1/R_1 = \theta_2/R_2 < 0.16,$$

where d is the width of the stripe, $R_1$ and $R_2$ are radii of curvature of the arcs, $\theta_1$ and $\theta_2$ are anticipated angles for the arcs, and L is the distance between the cleavage planes.

* * * * *